United States Patent
Bayruns (10) Patent No.: US 6,577,198 B1
(45) Date of Patent: Jun. 10, 2003

(54) ACTIVE POWER SPLITTER WITH IMPEDANCE MATCHING

(75) Inventor: John Thomas Bayruns, Middlesex, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/101,775

(22) Filed: Mar. 21, 2002

(51) Int. Cl.[7] .................................................. H03F 3/68
(52) U.S. Cl. ...................... 330/295; 330/84; 330/124 R; 333/124
(58) Field of Search ............................. 330/295, 124 R, 330/84; 333/124

(56) References Cited

U.S. PATENT DOCUMENTS

| | | | | |
|---|---|---|---|---|
| 2,946,943 A | * | 7/1960 | Nye et al. ..................... 318/448 |
| 3,243,585 A | * | 3/1966 | Escobosa ..................... 235/184 |
| 4,580,114 A | | 4/1986 | Upadhyayula .............. 333/100 |
| 4,789,845 A | | 12/1988 | Reddy ........................ 333/100 |
| 4,973,918 A | | 11/1990 | Schindler .................... 330/227 |
| 5,021,755 A | | 6/1991 | Gustafson ................... 333/128 |
| 5,045,822 A | | 9/1991 | Mohwinkel ................. 333/124 |
| 5,072,199 A | | 12/1991 | Furlow ........................ 333/124 |
| 5,175,508 A | * | 12/1992 | Gingrich et al. ............... 330/84 |
| 5,347,245 A | | 9/1994 | Wright, Jr. .................. 333/131 |
| 5,959,507 A | | 9/1999 | Gresko ........................ 333/100 |
| 6,118,354 A | | 9/2000 | Decramer et al. .......... 333/131 |
| 6,140,889 A | | 10/2000 | Chanteau .................... 333/131 |
| 6,292,052 B1 | * | 9/2001 | Carlson ........................ 330/9 |
| 6,300,828 B1 | * | 10/2001 | McInnis ................. 330/124 R |

* cited by examiner

Primary Examiner—Henry Choe
(74) Attorney, Agent, or Firm—Pennie & Edmonds LLP (57) ABSTRACT

A single-input/multiple output power splitter having internal feedback circuitry. A separate amplifying circuit, such as a transistor, is used to drive each of the outputs. The transistors may be arranged in a common source/emitter amplifying configuration in which the gates/bases are connected together as an input node. Each transistor has an associated feedback circuit including passive circuit elements, such as resistors. The passive circuit elements are connected between the drain/collector of its corresponding transistor and a common intermediate connecting node to which all feedback resistors are also connected. The common intermediate node is connected to the single input via a separate input resistor.

29 Claims, 6 Drawing Sheets

ACTIVE POWER SPLITTER WITH IMPEDANCE MATCHING

FIELD OF THE INVENTION

The present invention generally relates to a power splitter. More specifically, the present invention relates to an impedance matched active power splitter.

BACKGROUND OF THE INVENTION

When a system has multiple receivers that operate simultaneously there is a need to have the input signal split among all of the receivers. This should be done with a minimal loss or with amplification to keep a high signal-to-noise ratio (SNR) so that each receive path's SNR does not suffer. The splitter should be as small as possible and is preferably integrated. The signal range of the split should be as wide as possible to allow for wide band signal applications, such as cable receivers where input signals range from 55 MHz to 860 MHz. Also, the input and output impedances should be matched and the output ports should be isolated from each other.

U.S. Pat. Nos. 6,140,889, 6,118,354, 5,959,507, and 5,347,245 disclose passive power splitter concepts. The splitters disclosed in these patents have power loss with each output having less power than the input. And because they have loss, they effectively increase the noise floor for circuitry that comes after the power split. Also, these splitters need transformers. This reduces the probability for integration, because most radio frequency (RF) applications need ferrite materials to bring the response down to very high frequencies (VHF). In addition, these splitters increase minimum input signal level.

U.S. Pat. No. 5,021,755 discloses another passive power splitter in which transmission lines are used to replace the ferrite baluns. Because of the use of transmission lines, the splitter disclosed in this patent has an added reason for long lines. The line length dictates the lowest frequency to use. The splitter was intended for PC board applications and microwave frequencies. It cannot be integrated for VHF frequencies.

U.S. Pat. Nos. 5,072,199, 4,973,918, and 4,580,114 disclose active power splitter concepts. However, the power splitter disclosed in U.S. Pat. No. 5,072,199 has a topology where the output match and output isolation are enabled by a plurality of output stages, each of which includes a separate source follower field effect transistors (FET) and a single-gate active load FET. On the other hand, U.S. Pat. No. 4,580,114 discloses a topology where the output match comes from reactive filter matching techniques for each output. The output isolation is just that from the reverse isolation of field effect transistors (FETs). Neither the output match nor the output isolation uses feedback techniques. There is no input match. U.S. Pat. No. 4,973,918 is a distributed amp version of U.S. Pat. No. 4,580,114, except this patent discloses the utilization of some distributed amp input matching techniques.

U.S. Pat. No. 5,045,822 discloses the concept of out-of-phase signal cancellation for port-to-port isolation. As disclosed in this patent, the input match circuitry is not part of a feedback path and the signal passes right through it. The input match is composed of a capacitor and an inductor. Further, the splitter disclosed in this patent contains only two output ports. An extension to additional output ports would not work.

Figure 1:
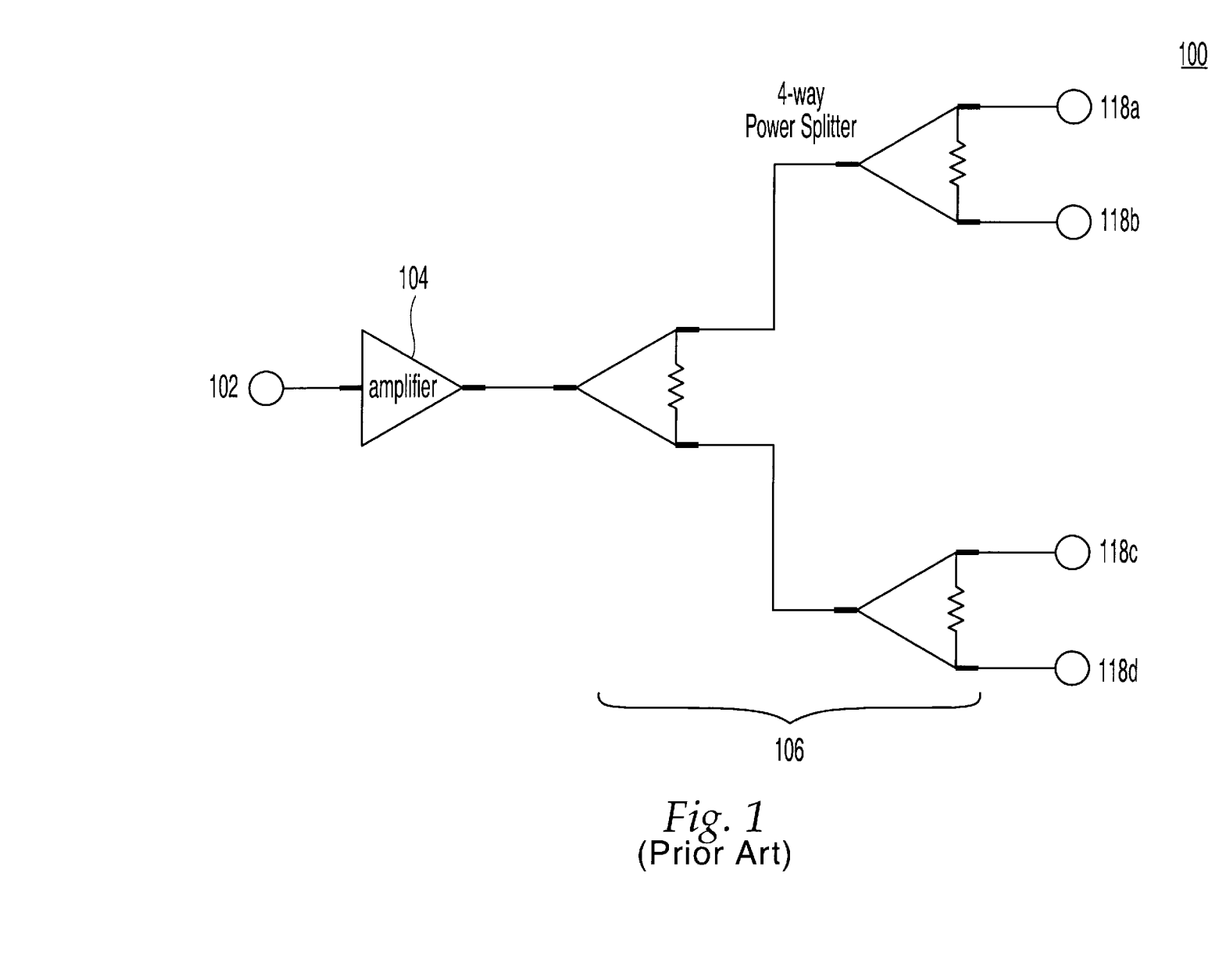
FIG. 1 shows a prior art power splitter.

FIG. 1 shows an example of a prior art power splitting topology 100. The topology of FIG. 1 comprises a matched amplifier followed by a passive power splitter. A power signal entering at the input port 102 is amplified by the amplifier 104 and split by the 4-way power splitter 106, in two stages, into four output signals. Each output signal arrives at an output port 118a, 118b, 118c and 188d, respectively. The passive power splitter is generally narrow band and large in size. It mainly uses transmission lines and some lumped elements. While it can be made entirely of lumped elements, the number and sizes of the lumped elements make the splitter relatively large rendering the splitter incapable of integration for frequencies lower than approximately 5 GHz.

Figure 2:
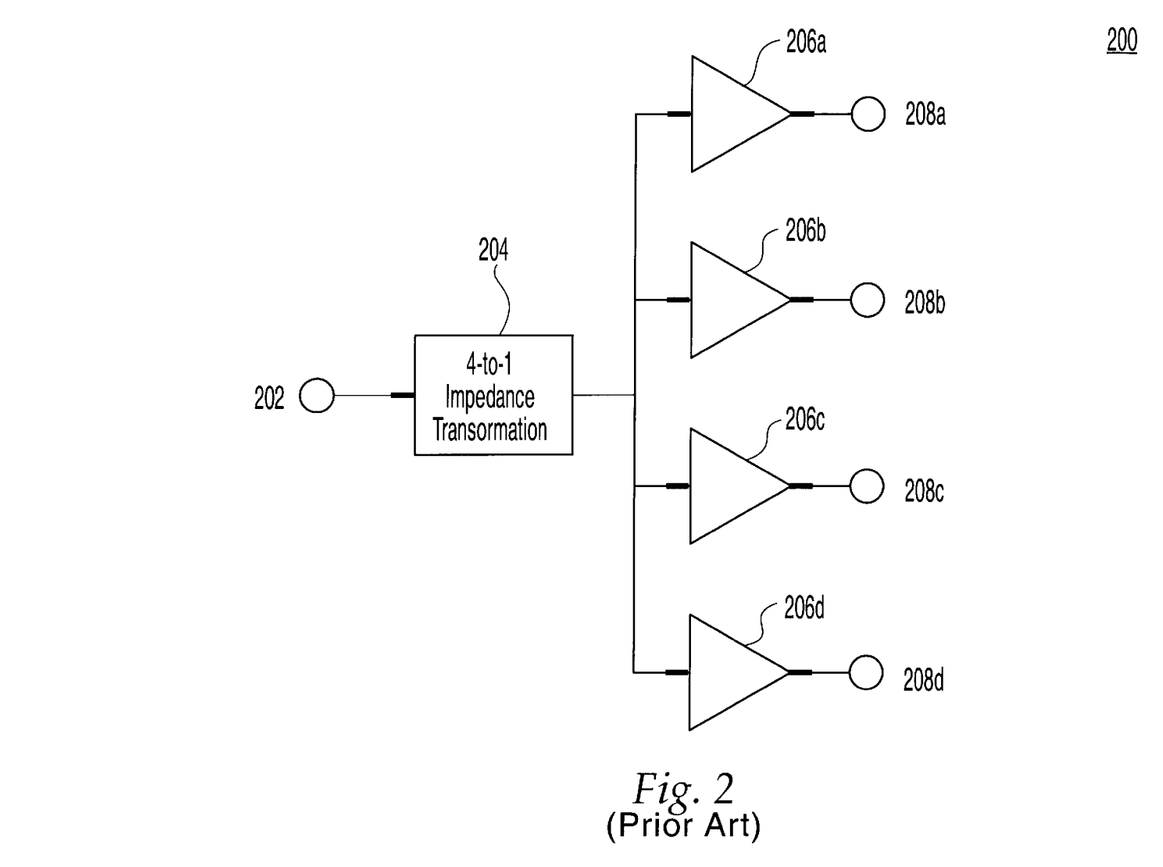
FIG. 2 shows another prior art power splitter.

FIG. 2 shows another example of a prior art power splitting topology 200. The input signal entering the input port 202 is subjected to an impedance transformation network 204. The impedance transformation network 204 prepares the input signal for presentation to a plurality of amplifiers 206a, 206b, 206c, 206d placed in parallel, resulting in the output signal being produced at output ports 208a, 208b, 208c, 208d, respectively. The impedance transformation 204 is provided at the input since the input impedance drops proportionally to the number of amplifiers in parallel. In the example shown in FIG. 2, a transformer is used to perform a 4-to-1 impedance transformation. This splitter is bandwidth-limited and introduces passive losses. It also can be quite large in size, mainly because of the need of the transformer.

SUMMARY OF THE INVENTION

The present invention is directed to a 1:N power splitter configured to split an input signal into a number N output signals.

The power splitter's various components may all reside on a single integrated circuit, preferably using gallium arsenide technology.

In one embodiment, the power splitter of the present invention includes an input node and a number N of output nodes; an input circuit connected between the input node and an intermediate node; N number of amplifying circuits, each connected between the input node and a corresponding one of the N output nodes; and N feedback circuits, each connected between the intermediate node and a corresponding one of the N output nodes.

The input and feedback circuits may comprise passive elements, such as resistors.

The amplifying circuits may be implemented using either field-effect transistors (FETs) or bipolar junction transistors (BJT's). If the transistor is an FET, it may be a GaAs FET.

Each amplifying circuit may comprise a single transistor. In such case, the input circuit may comprise a resistor having a resistance of $R_1$, each feedback circuit may comprise a resistor having a resistance of $R_2$; each transistor may have a transconductance of $G_M$, a load impedance of $R_L$, and a source impedance of $R_S$; the relationship $(NR_1+R_2+R_L)/[N(G_M R_L+1)]=(NR_1+R_2+NR_S)/(NG_M R_S+1)$ may hold. Under some conditions, the relationship $R_1+R_S=G_M R_2 R_S$ may hold, as well.

Each amplifying circuit may comprise first and second transistors cascaded together. In such case, the first transistor of each amplifying circuit may receive an input from the input node, an output of the first transistor may be connected to an input of the second transistor, and the second transistor of each amplifying circuit may have an output connected to a corresponding output node.

In another embodiment, the power splitter of the present invention has an input node, and a number N output nodes.

The power splitter also has N number of amplifying circuits, each amplifying circuit connected between the input node and a corresponding one of the N output nodes, and N number of feedback networks, each associated with one of said amplifying circuits. Each feedback network comprises an input circuit connected between the input node and an intermediate node, a feedback circuit connected between said intermediate node and the corresponding one of the N output nodes; and a divider circuit connected between said intermediate node and a common node that is common to all the feedback networks.

In this second embodiment, each input circuit may comprises a resistor with all input circuits having identical resistors, each feedback circuit may comprise a resistor with all feedback circuits having identical resistors, and each third circuit may comprise a resistor with all third circuits having identical resistors.

BRIEF DESCRIPTION OF THE DRAWINGS

The present invention is described in detail below with reference to the drawings in which.

DETAILED DESCRIPTION OF PREFERRED EMBODIMENTS

Figure 3:
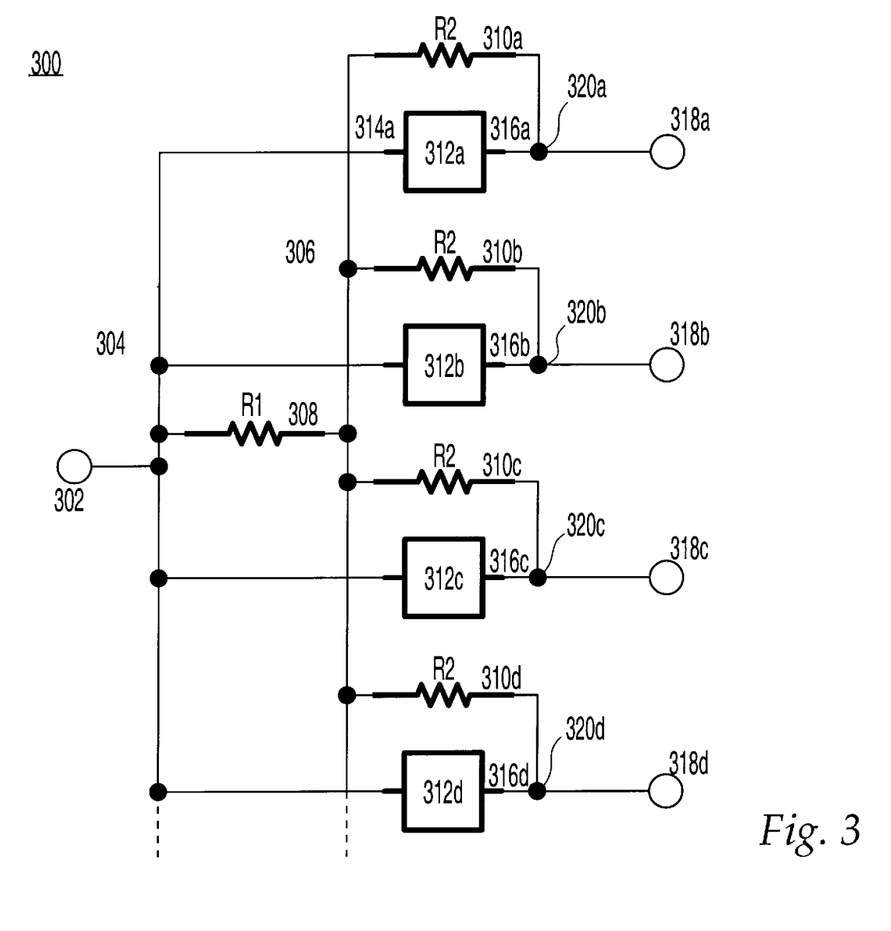
FIG. 3 shows a power splitter according to one embodiment of the present invention.

FIG. 3 shows a 1:4 power splitter according to one embodiment of the present invention. As shown in FIG. 3, the power splitter 300 comprises one input port 302 and a plurality of output ports 318a, 318b, 318c and 318d. The input port 302 is connected to a first, input node 304, while each of the output ports 318a, 318b, 318c and 318d, is connected to a corresponding output node 320a, 320b, 320c, 320d, respectively. An input circuit 308 is connected between the first node 304 and a second, internal node 306. Preferably, the input circuit 308 comprises a passive element, shown in FIG. 3 to be a resistor R1. A separate amplifying circuit is connected between the input node and a corresponding one of the four output nodes. Amplifying circuit 312a, which is representative of the other amplifying circuits 312b, 312c, 312d, has an input 314a connected to the input node 304, and an output 316a (representative of outputs 316b, 316c, 316d) connected to the output node 320a. A feedback circuit 310a is connected between the intermediate node 306 and the output node 320a. The feedback circuit 310a comprises one or more passive elements and, in the preferred embodiment, comprises a resistor R2.

In the parlance of the present application, it is understood that a "port" refers to a connection to the power splitter, while a "node" refers to a portion of the power splitter at which two or more electrical paths connect. It is further understood that, electrically speaking, an "output port" and its corresponding "output node" may be one and the same thing, and likewise an "input port" and an "input node" may be one and the same.

Preferably, all the amplifying circuits and the feedback circuits are identical, and they, along with the input node, the intermediate node and the output nodes all reside on a single integrated circuit, preferably using gallium arsenide (GaAs) technology. And while the foregoing embodiment of FIG. 3 shows a 1:4 power splitter has been shown, it should be kept in mind that the power splitter may be implemented with a different number N of amplifying circuits, feedback resistors, output nodes and output ports.

As discussed above, the power splitter 300 has a single input/multiple output topology. A separate amplifying circuit 312a, 312b, 312c, 312d is used to drive each of the outputs 318a, 318b, 318c, 318d, respectively. And an amplifying circuit 312a has associated therewith a feedback circuit 310a, which is used to enable the impedance match and port-to-port isolation. As indicated in FIG. 3, the feedback circuit is the only approach the power splitter 300 utilizes to obtain all port matches (input and output) and port-to-port isolation.

The feedback approach used here allows for a matched input and matched individual output impedance levels simultaneously. The ability of this design to match input impedance with output impedance depends on the values of the impedances of the input circuit 308 and the feedback circuit 310a. The input impedance and each output impedance can be calculated from the impedances of the input circuit 308 and the feedback circuit 310a and the parameters of the amplifying circuit 312a. By adjusting the impedances of the input circuit 308 and the feedback circuit 310a, as well as the parameters of the amplifying circuit 312a, a match can be made between the input impedance and each output impedance.

The feedback approach also allows for high port-to-port isolation among all of the output ports. This isolation can be made without the need of bulky reactive elements and can be made for very wide bandwidth. As shown in FIG. 3, the feedback circuits 310a, 310b, 310c, 310d add an additional signal path between the output ports 318a, 318b, 318c, 318d, respectively. The leakage between output ports can be expressed in terms of the impedances of the input circuit 308 and the feedback circuits 310a, 310b, 310c, 310d, as well as the parameters of the amplifying circuit 312. Because there exist two signal paths from any one output port to any other output port and because one of these paths has a sign inversion, the impedances of the input circuit 308 and the feedback circuits and the parameters of the amplifying circuits can be adjusted to cancel out the leakage. The end result is a cancellation of the signal paths to effectively isolate the output ports.

In FIG. 3, it should be noted that the amplifying circuits 312a, 312b, 312c, 312d may be transconductance amplifiers. Further, each transconductance amplifier may be implemented in a number of ways, such as a single transistor with all transistors in a common source/emitter amplifier arrangement, as discussed below with respect to FIG. 4, or as a pair of transistors in a cascode arrangement, as discussed below with respect to FIG. 5.

Figure 4:
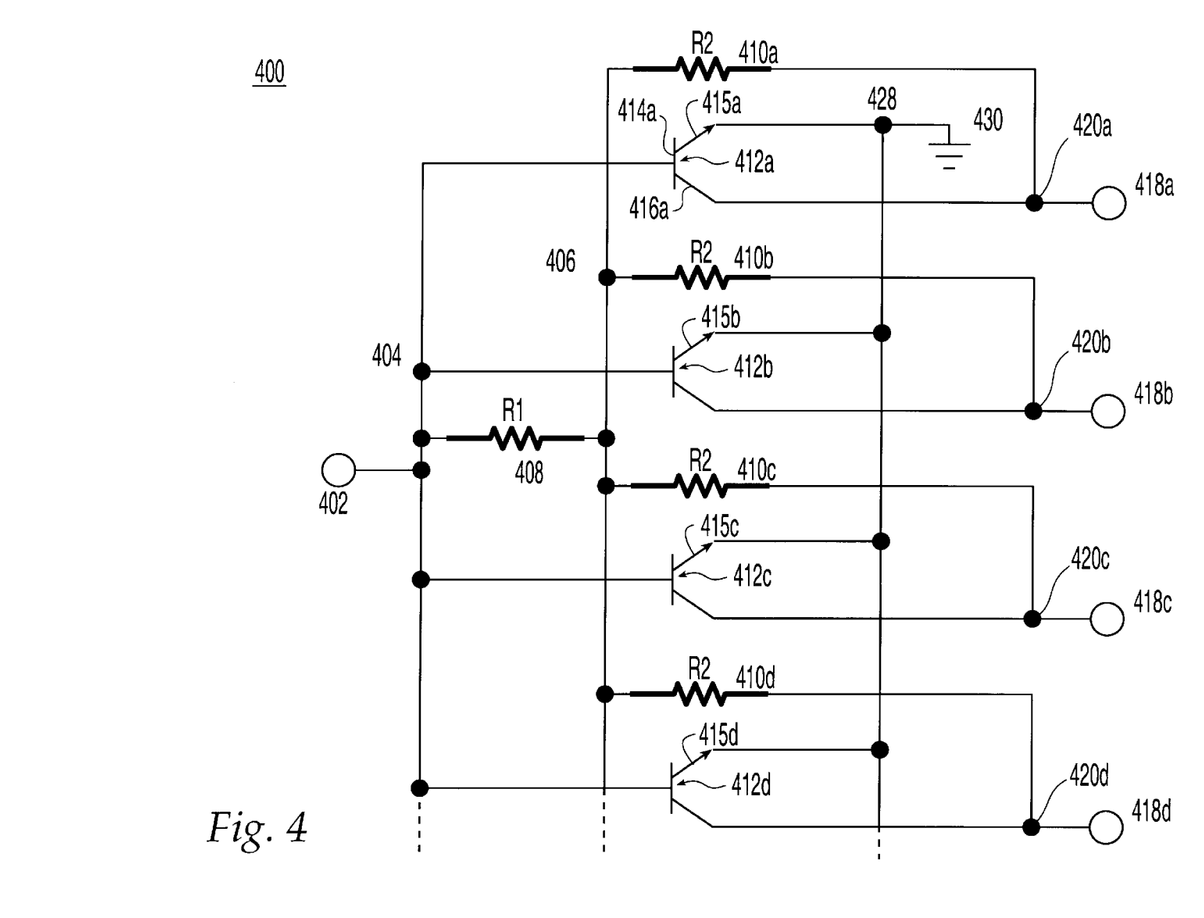
FIG. 4 shows the power splitter of FIG. 3 with an amplifier having a first configuration.

FIG. 4 shows a power splitter in which each amplifying circuit is implemented as a transconductance amplifier to drive each of the outputs. Preferably, each transconductance amplifier comprises a single transistor. The transistor is preferably a three-terminal transistor and, in a preferred embodiment, is a GaAs field effect transistor (FET), or a bipolar junction transistor, as seen in FIG. 4.

As shown in FIG. 4, the power splitter 400 comprises one input port 402 and a total of four output ports 418a, 418b, 418c, 418d, in keeping with the embodiment of FIG. 3. The input port 402 is connected to a first, input node 404 and an input circuit 408 is connected between the input node 404 and a second, intermediate node 406. Preferably, the input circuit 408 comprises a single resistor with a resistance $R_1$. Each amplifying circuit comprises a transistor 412a, 412b, 412c, 412d connected between the input node 404 and each output node 420a, 420b, 420c, 420d. As seen in FIG. 4, the input node is connected to the gate/base 414a of a transistor 412a while the output node is connected to the drain/collector 416a of that transistor. Furthermore, the several transistors 412a, 412b, 412c, 412d are used in a common source/emitter amplifier arrangement, with the sources/emitters 415a, 415b, 415c, 415d connected together to a third node 428, which is preferably grounded, and optionally grounded via a resistor.

A feedback circuit 410a, 410b, 410c, 410d is connected between the second node 406 and the corresponding output node 420a, 420b, 420c, 420d, respectively, for a particular transistor. As seen in FIG. 4, this means that each feedback circuit is tied to the drain of its corresponding transistor. Furthermore, each feedback circuit comprises a passive element, such as single resistor $R_2$, with all the feedback circuits being identical to one another. Also, preferably, all of the circuitry of the power splitter 400 resides on a single integrated circuit.

As discussed above, the power splitter 400 uses source/emitter coupled stages with feedback to have an output match and provide output isolation. The ability of this feedback approach to match the input impedance with the output impedance depends on the values of $R_1$ and $R_2$. The expressions for the input impedance and each output impedance are:

$$Z_I = (NR_1 + R_2 + R_L)/[N(G_M R_L + 1)], \text{ and}$$

$$Z_M = (NR_1 + R_2 + NR_S)/(NG_M R_S + 1),$$

where $R_L$, $R_S$, N, $G_M$, $Z_I$, and $Z_M$ are load impedance, source impedance, number of outputs, FET transconductance, input impedance, and output impedance of the Mth output, respectively. By adjusting $R_1$, $R_2$, $R_L$, $R_S$, N, and $G_M$, the input impedance $Z_I$ and output impedance $Z_M$ can be matched.

And because there exist two signal paths from any one output port to any other output port and one of these paths has a sign inversion, the end result will be a cancellation of the signal paths to effectively isolate the output ports. The corresponding equation for port-to-port leakage is:

$$LEAK = NR_L(R_1 + R_S - G_M R_2 R_S)/[(R_2 + R_L)(NR_1 + R_1 + NR_S)],$$

and so the value of "LEAK" can go to zero (implying infinite isolation) when $R_1$, $R_2$, $R_S$, and $G_M$ are such that $R_1 + R_S = G_M R_2 R_S$.

Figure 5:
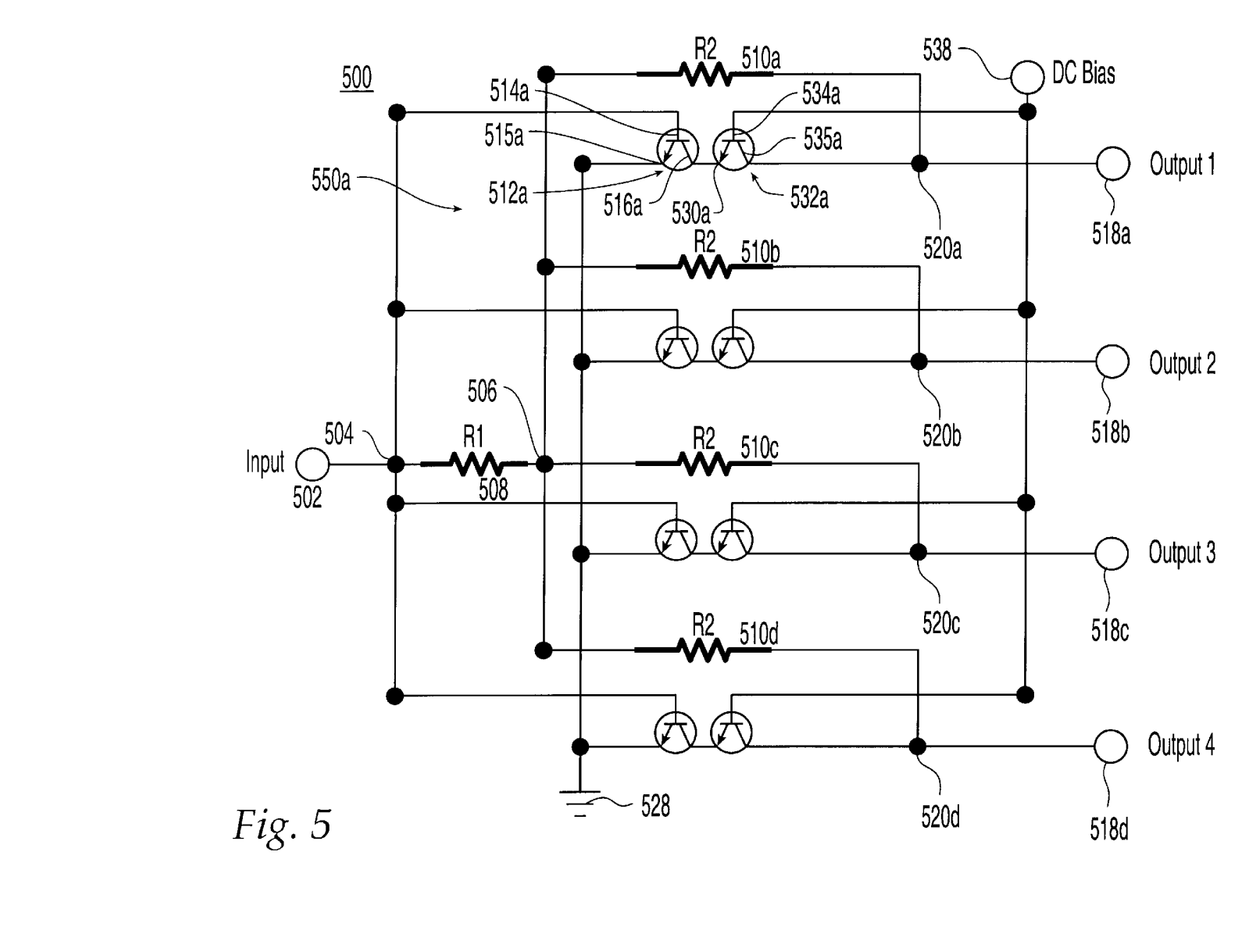
FIG. 5 shows the power splitter of FIG. 3 with an amplifier having a second configuration.

FIG. 5 shows a power splitter 500 comprising an input port 502 connected to a first, input node 504, an intermediate node 506, four output nodes, 520a, 520b, 520c, 520d, and a plurality of corresponding output ports 518a, 518b, 518c, 518d, respectively. An input circuit 508 is connected between the input node 504 and a second, intermediate node 506. Preferably, the input circuit 508 comprises passive elements only, such as a single resistor with resistance $R_1$.

The amplifying circuits in power splitter 500 each comprise a transconductance amplifier connected between the input node 504 and the output nodes. Since the amplifying circuits preferably are identical, only one of these is described. Transconductance amplifier 550a includes first transistor 512a and a second transistor 532a in a cascode arrangement. Preferably, the first and second transistors are FETs, although BJT's may also be used, as shown. As seen in FIG. 5, the gate/base 514a of the first transistor 512a is connected to the input node 504, and its drain/collector 516a is connected to the source/emitter of the second transistor 532a, while the drain/collector 535a of the second transistor 532a is connected to the output node 520a and so to the output port 518a. The source/emitter 515a of the first transistor 512a is connected together to the sources/emitters of the first transistors in the other transconductance amplifiers to thereby form a first common node which preferably is tied to ground 528. In addition, the gate/base 534a of the second transistor 532a is preferably connected to a DC bias 538. A feedback circuit 510a is connected between the intermediate node 506 and the output node 520a (to which drain/collector 535a of the second transistor 532a is also connected). Preferably, the feedback circuit 510a is passive, being implemented by a resistor R2.

The feedback circuit 510a in FIG. 5 is used to enable the impedance match and port-to-port isolation. The capability of this feedback approach to keep the input impedance and the output impedances matched depends on the values of the impedances of the input circuit 508 and the feedback circuit 510a. The input impedance and each output impedance can be calculated from the impedances of the input circuit 508 and the feedback circuit 510a and the parameters of the first transistor 512a and the second transistor 532a. By adjusting the impedances of the input circuit 508 and the feedback circuit 510a, as well as the parameters of the first and second transistors, a match can be made between the input impedance and each output impedance, in a way similar to that discussed above in connection with FIG. 4. And similar to the implementation of FIG. 4, the four amplifying circuits in FIG. 5 preferably are identical, and the power splitter 500 resides on a single integrated circuit.

And like the implementation of FIG. 4, the feedback circuits 510a, 510b, 510c, 510d add an additional signal path between output ports. The leakage between output ports can be expressed in terms of the impedances of the input circuit 508 and the feedback circuits, as well as the parameters of the pairs of first and second transistors. Because there exist two signal paths from any one output port to any other output port and because one of these paths has a sign inversion, the impedances of the input circuit 508 and the feedback circuits and the parameters of the pairs of first and second transistors can be adjusted to cancel out the leakage, in a way similar to that discussed above in connection with FIG. 4. The end result is a cancellation of the signal paths to effectively isolate the output ports.

Figure 6:
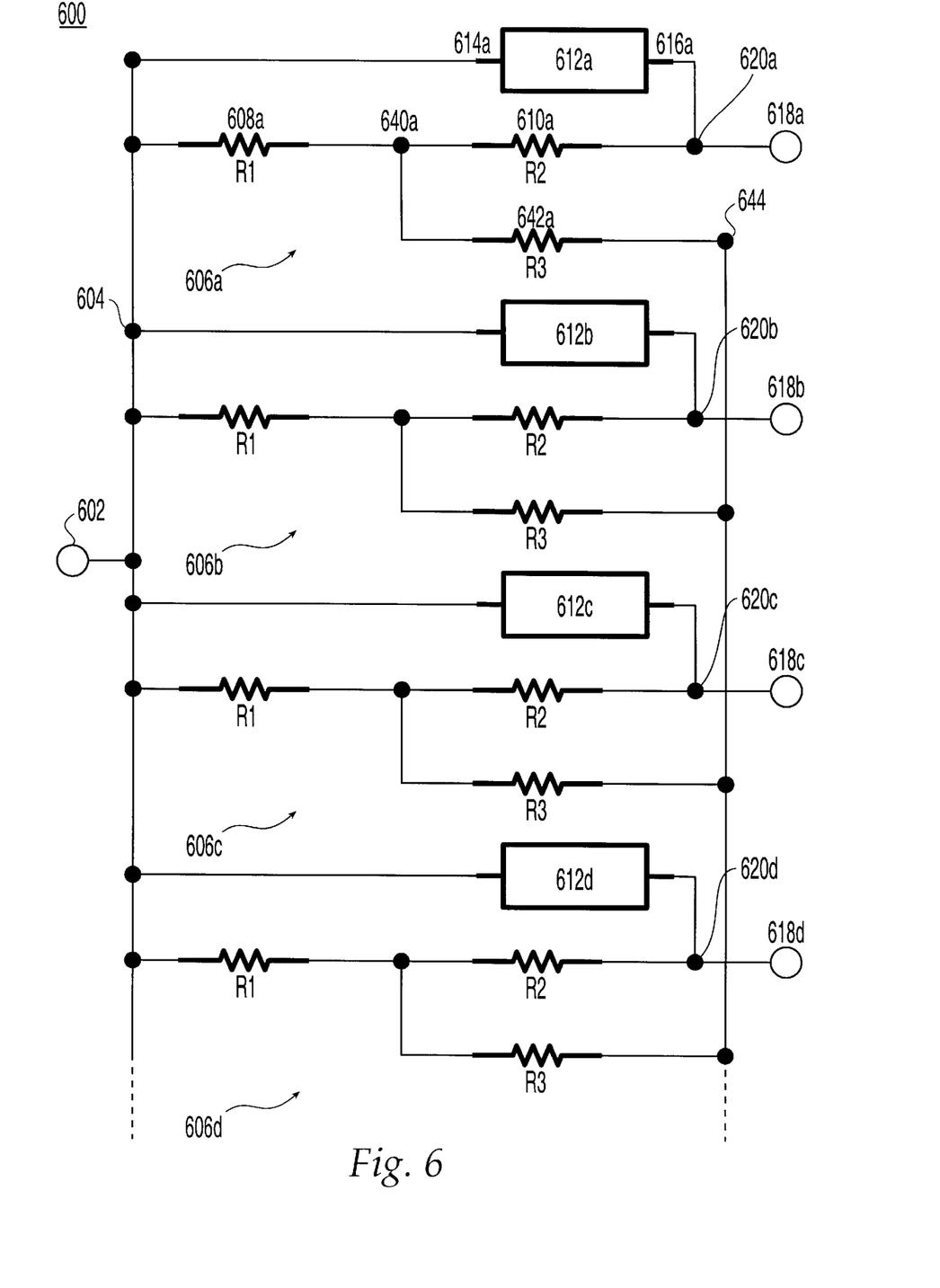
FIG. 6 shows a power splitter according to another embodiment of the present invention.

FIG. 6 shows a power splitter according to a second embodiment of the present invention. While the topology in FIG. 3 comprises a singular input circuit 308 connected to a plurality of feedback circuits 310a, 310b, 310c, 310d through a single internal node 306, the power splitter 600 in FIG. 6 has a complex topology with a plurality of internal nodes. Preferably, all of the circuitry of the power splitter 600 resides on a single integrated circuit.

As shown in FIG. 6, the power splitter 600 comprises one input port 602 connected to a first, input node, and four output nodes 620a, 620b, 620c, 620d, connected to four corresponding output ports 618a, 618b, 618c, 618d, respectively. The input port 602 is connected to a first node 604. An amplifying circuit 612a, 612b, 612c, 612d is connected between the input node 604 and a corresponding output node port 618a, 618b, 618c, 618d, respectively. The first node 604 is connected to an input 614a of the amplifying circuit 612a while the output node is connected to an output 616a of the amplifying circuit 612a.

In the embodiment of FIG. 6, the amplifying circuits 612a, 612b, 612c, 612d preferably are transconductance amplifiers. Each transconductance amplifier may be a single transistor (with all transistors in a common source/emitter amplifier arrangement) or a series of two transistors in a cascode arrangement. A typical cascode arrangement has a combination of two transistors stacked on top of each other where the source/emitter of the top transistor is connected to the drain/collector of the bottom transistor. The gate/base of the bottom transistor is the input node whereas the drain/collector of the top transistor is the output node. The source/emitter of the bottom transistor is then grounded. The gate/base of the top transistor is generally connected to a DC bias.

Amplifying circuit 612a is provided with its own feedback network 606a. Feedback Network 606a includes a first, input circuit 608a connected between the input node 604 and an intermediate node 640a, a second, feedback circuit 610a connected between said intermediate node and the corresponding one of the N output nodes; and a third, divider circuit 642a connected between the intermediate node 640a and common node 644 that is common to all the feedback networks 606a, 606b, 606c, 606d. Preferably, the input circuit 608a, the feedback circuit 610a, and the divider circuit 642a each are passive, comprising resistors having values $R_1$, $R_2$, and $R_3$, respectively.

In the power splitter 600, four such amplifying circuits 612a, 612b, 612c, 612d and four such feedback networks 606a, 606b, 606c, 606d are provided. It is understood, however, some other number N may be provided to form a 1:N power splitter with this embodiment, just as with the embodiment of FIG. 3. The feedback networks are used to enable the impedance match and port-to-port isolation, and preferably are the only items used by the power splitter 600 to match impedances, while also providing port-to-port isolation.

And as in the case with the embodiment of FIG. 3, the ability of this feedback approach to keep the input impedance and the output impedances matched depends on the values of the impedances of the input, feedback and divider circuits within the feedback networks 606a, 606b, 606c, 606d. By adjusting the impedances of these circuits, as well as the parameters of the amplifying circuits 612a, 612b, 612c, 612d, the input impedance can be matched to each output impedance, in a way similar to that discussed above with reference to FIG. 4.

Furthermore, as shown in FIG. 6, the feedback networks 606a, 606b, 606c, 606d add an additional signal path between output ports. The leakage between output ports can be expressed in terms of the impedances of these feedback networks, as well as the parameters of the amplifying circuits 612a, 612b, 612c, 612d. Because there are two signal paths from any one output port to any other output port, and because one of these paths has a sign inversion, the impedances of the three feedback networks and the parameters of the amplifying circuits 612a, 612b, 612c, 612d can be adjusted to cancel out the leakage, in a manner similar to that discussed above in connection with FIG. 4. The end result is a cancellation of the signal paths to effectively isolate the output ports.

While the invention has been described and illustrated herein with respect to preferred embodiments, it should be apparent that various alternatives, modifications, adaptions, and variations will be apparent to those skilled in the art and may be made utilizing the teachings of the present disclosure without departing from the scope of the invention and are intended to be within the scope of the invention as defined by the claims herein.

What is claimed is:

1. A 1:N power splitter configured to split an input signal into a number N output signals, comprising:

an input node and a number N of output nodes;

an input circuit connected between the input node and an intermediate node;

N number of amplifying circuits, each connected between the input node and a corresponding one of the N output nodes; and N feedback circuits, each connected between the intermediate node and a corresponding one of the N output nodes;

such that the N output signals appear at the N output nodes and are substantially identical to one another.

2. The power splitter of claim 1, wherein the input circuit comprises a resistor.

3. The power splitter of claim 1, wherein each feedback circuit comprises a resistor.

4. The power splitter of claim 1, wherein:

the input circuit comprises a resistor; and each feedback circuit comprises a resistor, with each feedback circuit having identical resistors.

5. The power splitter of claim 1, wherein the input and output nodes, the intermediate node, the input circuit, the amplifying circuits, and the feedback circuits all reside on a single integrated circuit.

6. The power splitter of claim 1, wherein each amplifying circuit comprises a transconductance amplifier.

7. The power splitter of claim 1, wherein each amplifying circuit comprises a transistor.

8. The power splitter of claim 7, wherein each transistor comprises a base connected to said input node and a collector connected to the output node.

9. The power splitter of claim 8, wherein each transistor comprises an emitter, and wherein the emitters of all N transistors are tied to a common ground.

10. The power splitter of claim 7, wherein each transistor comprises a gate connected to said input node and a drain connected to the output node.

11. The power splitter of claim 10, wherein each transistor comprises a source, and wherein the sources of all N transistors are tied to a common ground.

12. The power splitter of claim 7, wherein each transistor is a GaAs field effect transistor (FET).

13. The power splitter of claim 12, wherein:

the input circuit comprises a resistor having a resistance of $R_1$;

each feedback circuit comprises a resistor having a resistance of $R_2$;

each transistor has a transconductance of $G_M$, a load impedance of $R_L$, and a source impedance of $R_S$; and wherein $$(NR_1+R_2+R_L)/[N(G_M R_L+1)]=(NR_1+R_2+NR_S)/(NG_M R_S+1).$$

14. The power splitter of claim 12, wherein:

the input circuit comprises a resistor having a resistance of $R_1$;

each feedback circuit comprises a resistor having a resistance of $R_2$;

each transistor has a transconductance of $G_M$, and a source impedance of $R_S$; and wherein $$R_1+R_S=G_M R_2 R_S.$$

15. The power splitter of claim 1, wherein each amplifying circuit comprises first and second transistors in a cascode configuration, the first transistor of each amplifying circuit receiving an input from said input node, the second transistor of each amplifying circuit having an output connected to one of the N output nodes.

16. The power splitter of claim 15, wherein:
the first transistor in each amplifying circuit comprises a base connected to said input node; and
the second transistor in each amplifying circuit comprises a base connected to a DC bias input.

17. The power splitter of claim 16, wherein:
the first transistor in each amplifying circuit further comprises an emitter and a collector;
the second transistor in each amplifying circuit further comprises an emitter and a collector;
the emitter of the first transistor is connected to ground;
the collector of the first transistor is connected to the emitter of the second transistor; and
the collector of the second transistor is connected to said one of the N output nodes.

18. The power splitter of claim 15, wherein:
the first transistor in each amplifying circuit comprises a gate connected to said input node; and
the second transistor in each amplifying circuit comprises a gate connected to a DC bias input.

19. The power splitter of claim 18, wherein:
the first transistor in each amplifying circuit further comprises a source and a drain;
the second transistor in each amplifying circuit further comprises a source and a drain;
the source of the first transistor is connected to ground;
the drain of the first transistor is connected to the source of the second transistor; and
the drain of the second transistor is connected to said one of the N output nodes.

20. The power splitter of claim 15, wherein each transistor is a GaAs field effect transistor (FET).

21. The power splitter of claim 15, wherein the input and output nodes, the intermediate node, the input circuit, the amplifying circuits, and the feedback circuits all reside on a single integrated circuit.

22. A 1:N power splitter configured to split an input signal into a number N output signals, comprising:
an input node and a number N of output nodes;
N number of amplifying circuits, each amplifying circuit connected between the input node and a corresponding one of the N output nodes,
N number of feedback networks, each associated with one of said amplifying circuits, each feedback network comprising:

an input circuit connected between the input node and an intermediate node;
a feedback circuit connected between said intermediate node and the corresponding one of the N output nodes; and
a third circuit connected between said intermediate node and a common node common to all the feedback networks.

23. The power splitter of claim 22, wherein each input circuit comprises a resistor.

24. The power splitter of claim 22, wherein each feedback circuit comprises a resistor.

25. The power splitter of claim 22, wherein each third circuit comprises a resistor.

26. The power splitter of claim 22, wherein:
each input circuit comprises a resistor with all input circuits having identical resistors; and
each feedback circuit comprises a resistor with all feedback circuits having identical resistors; and
each third circuit comprises a resistor with all third circuits having identical resistors.

27. The power splitter of claim 22, wherein the input and output nodes, the amplifying circuits, and the feedback networks all reside on a single integrated circuit.

28. The power splitter of claim 22, wherein the amplifying circuits comprise transconductance amplifiers.

29. A 1:N power splitter configured to split an input signal into a number N output signals, comprising:
an input node and a number N of output nodes;
an input circuit connected between the input node and an intermediate node;
N number of amplifying circuits, each connected between the input node and a corresponding one of the N output nodes; and
N feedback circuits, each connected between the intermediate node and a corresponding one of the N output nodes;
wherein:
each amplifying circuit comprises a transconductance amplifier having a transistor;
the input circuit comprises a resistor having a resistance of $R_1$;
each feedback circuit comprises a resistor having a resistance of $R_2$;
each transistor has a transconductance of $G_M$, a load impedance of $R_L$, and a source impedance of $R_S$;

$$(NR_1+R_2+R_L)/[N(G_MR_L+1)]=(NR_1+R_2+NR_S)/(NG_MR_S+1); \text{ and}$$

the input and output nodes, the intermediate node, the input circuit, the amplifying circuits, and the feedback circuits all reside on a single integrated circuit.

* * * * *